US009209367B2

(12) United States Patent
Boss et al.

(10) Patent No.: US 9,209,367 B2
(45) Date of Patent: *Dec. 8, 2015

(54) ELECTRICAL COMPONENT AND METHOD OF PRODUCING ELECTRICAL COMPONENTS

(71) Applicant: OSRAM Opto Semiconductors GmbH, Regensburg (DE)

(72) Inventors: Markus Boss, Regensburg (DE); Markus Pindl, Tegernheim (DE); Tobias Gebuhr, Regensburg (DE); Simon Jerebic, Tegernheim (DE); Martin Brandl, Kelheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/410,956

(22) PCT Filed: Jun. 18, 2013

(86) PCT No.: PCT/EP2013/062614
§ 371 (c)(1),
(2) Date: Dec. 23, 2014

(87) PCT Pub. No.: WO2014/001148
PCT Pub. Date: Jan. 3, 2014

(65) Prior Publication Data
US 2015/0214446 A1    Jul. 30, 2015

(30) Foreign Application Priority Data
Jun. 28, 2012  (DE) .......................... 10 2012 211 220

(51) Int. Cl.
*H01L 33/00* (2010.01)
*H01L 33/54* (2010.01)
(Continued)

(52) U.S. Cl.
CPC .............. *H01L 33/54* (2013.01); *H01L 21/565* (2013.01); *H01L 21/78* (2013.01); *H01L 23/29* (2013.01);
(Continued)

(58) Field of Classification Search
USPC ........... 257/81, 82, 91, 98, 99, 100, 116, 117, 257/432–437, 749, E33.056–E33.059, 257/E25.032, 457, 459, 666–677, 257/E23.031–E23.059, E21.502, E21.001, 257/E21.503, E21.5, E21.536, E23.02, 257/E23.033, E23.036, E23.116, E33.001; 438/111, 112, 113, 25, 51, 55
See application file for complete search history.

(56) References Cited
U.S. PATENT DOCUMENTS 4,840,568 A * 6/1989 Burroughs ............. H01R 24/58
361/801
5,834,831 A * 11/1998 Kubota ............... H01L 23/4334
257/666

(Continued)

FOREIGN PATENT DOCUMENTS

DE   10 2005 041 064 A1   3/2007
DE   10 2010 023 815 A1  12/2011
DE   10 2010 025 319 A1  12/2011
WO   WO 2005013364 A2 *  2/2005  .......... H01L 23/3128

Primary Examiner — Dao H Nguyen
Assistant Examiner — Tram H Nguyen
(74) Attorney, Agent, or Firm — DLA Piper LLP (US)

(57) ABSTRACT

An electrical component includes a closed lead frame with a passage opening at least one electrical component arranged within the passage opening, the electrical component including a first contact pad on one side of the electrical component and a second contact pad on a second side of the electric component, wherein the second side faces the first side and the second contact pad is electrically coupled to the lead frame; and an encapsulation which mechanically couples the electrical component to the lead frame, wherein the lead frame includes a recess on one side, the recess extending from an edge of the lead frame to the passage opening and connecting at least one electrical connecting element from the edge of the lead frame to the component arranged in the passage opening.

15 Claims, 3 Drawing Sheets

(51) Int. Cl.
*H01L 33/48* (2010.01)
*H01L 33/62* (2010.01)
*H01L 21/56* (2006.01)
*H01L 21/78* (2006.01)
*H01L 23/29* (2006.01)
*H01L 23/498* (2006.01)
*H01L 33/58* (2010.01)

(52) U.S. Cl.
CPC .... *H01L 23/49811* (2013.01); *H01L 23/49861* (2013.01); *H01L 33/486* (2013.01); *H01L 33/58* (2013.01); *H01L 33/62* (2013.01); *H01L 2224/48091* (2013.01); *H01L 2224/73265* (2013.01); *H01L 2933/005* (2013.01)

(56) References Cited

U.S. PATENT DOCUMENTS

| | | | | |
|---|---|---|---|---|
| 6,358,773 | B1* | 3/2002 | Lin | H01L 21/4846 |
| | | | | 257/E21.504 |
| 6,724,071 | B2* | 4/2004 | Combs | H01L 23/4334 |
| | | | | 257/666 |
| 7,242,068 | B2* | 7/2007 | Huang | H01L 27/14618 |
| | | | | 257/433 |
| 2011/0121339 | A1 | 5/2011 | Wu | |
| 2013/0099366 | A1* | 4/2013 | Cruz | H01L 23/495 |
| | | | | 257/676 |
| 2013/0256733 | A1* | 10/2013 | Lin | H01L 33/62 |
| | | | | 257/99 |

* cited by examiner

ELECTRICAL COMPONENT AND METHOD OF PRODUCING ELECTRICAL COMPONENTS

TECHNICAL FIELD

This disclosure relates to an electrical component and a method of producing electrical components.

BACKGROUND

Components such as light-emitting diodes (LED) may be assembled on component carriers which are also referred to as lead frames, and encapsulated by a compound to obtain a finished electrical component. To guarantee a sufficiently high mechanical stability of the component, mechanical support structures such as ceramic substrates or pre-shaped housing components are used. Ceramic substrates, however, are expensive and pre-shaped housing components require additional process steps.

Thus, it could be helpful to provide an inexpensive and easy-to-produce component without mechanical support structures.

SUMMARY

We provide an electrical component including a closed lead frame with a passage opening, at least one electrical component arranged within the passage opening, the electrical component including a first contact pad on one side of the electrical component and a second contact pad on a second side of the electrical component, wherein the second side faces the first side and the second contact pad is electrically coupled to the lead frame; and an encapsulation which mechanically couples the electrical component to the lead frame, wherein the lead frame includes a recess on one side, the recess extending from an edge of the lead frame to the passage opening and connecting at least one electrical connecting element from the edge of the lead frame to the component arranged in the passage opening.

We also provide a method of producing an electrical component including providing a carrier sheet; depositing a closed lead frame on the carrier sheet, the lead frame including a passage opening; placing at least one component into the passage opening of the lead frame, a first contact pad of the component being brought into contact with the carrier sheet; electrically coupling a second contact pad of the component to the lead frame; depositing an encapsulation on the electrical component and on the lead frame, the encapsulation mechanically coupling the electrical component to the lead frame; and removing the carrier sheet, wherein the lead frame includes a recess on one side, the recess extending from an edge of the lead frame to the passage opening and connecting at least one electrical connecting element from the edge of the lead frame to the component arranged in the passage opening.

We further provide an electrical component including a closed lead frame with a passage opening; at least one electrical component arranged within the passage opening, the electrical component including a first contact pad on one side of the electrical component and a second contact pad on a second side of the electrical component, wherein the second side faces the first side and the second contact pad is electrically coupled to the lead frame; and an encapsulation which mechanically couples the electrical component to the lead frame, wherein the lead frame includes at least one anchoring structure configured such that the encapsulation is anchored to the lead frame.

Figure 1:
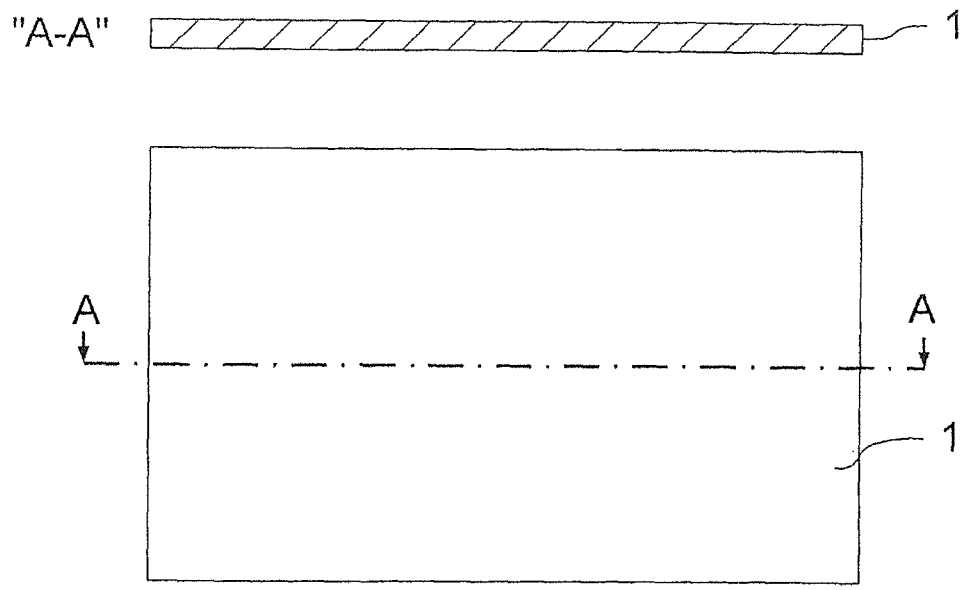
FIG. 1 shows an example of a carrier sheet.

REFERENCE LIST 1 carrier sheet
2 lead frame
3 passage opening
4 recess
5 component
6 first contact pad
7 second contact pad
8 bond wire
9 encapsulation
10 anchoring structure
11 first side of the component
12 second side of the component
13 lead-frame edge
14 lead-frame arrangement
15 component
16 parting line
X first direction
Y second direction

DETAILED DESCRIPTION

We provide an electrical component comprising a closed lead frame with a passage opening; at least one electrical component arranged within the passage opening, the electrical component comprising a first contact pad on a first side of the electrical component and a second contact pad on a second side of the electrical component facing the first side; the second contact pad being electrically connected to the lead frame; and an encapsulation mechanically coupling the electrical component to the lead frame.

The electrical component is arranged within a passage opening of the closed lead frame. Since the lead frame is closed, i.e., surrounds the electrical component without interruption, it has high mechanical stability, thus not requiring additional mechanical supporting structures.

Advantageously, the lead frame comprises at least one anchoring structure configured such that the encapsulation is anchored to the lead frame.

The anchoring structure reinforces the connection of the encapsulation to the lead frame. The encapsulation may thus contribute to the mechanical stability of the electrical component.

Advantageously, the lead frame comprises a recess on one side, the recess extending from the edge of the lead frame to the passage opening.

By the recess extending from an edge of the lead frame to the passage opening, the electrical component may be provided with connecting lines.

Advantageously, the component is an opto-electrical component, particularly a light-emitting component, particularly a light-emitting diode.

Advantageously, the encapsulation provides a lens for the opto-electrical component.

The encapsulation is permeable for the radiation emitted from or received by the opto-electrical component and additionally configured as a lens so that an even radiation or a focusing of the radiation onto the component is achieved.

Furthermore, we provide a method of producing an electric component, the method comprising: providing a carrier sheet; depositing a closed lead-frame on the carrier sheet, the lead-frame comprising a passage opening; placing at least one component in the passage opening, a first contact pad of the component being brought into contact with the carrier sheet; depositing an encapsulation on the electrical component and on the lead-frame; and removing the carrier sheet.

The closed lead frame in the passage opening of which the component is arranged has a high stability so that additional mechanical supporting structures are not required. By removing the carrier sheet, the electrical component has a smaller height. The first contact pad of the component may serve as a soldering joint of the component so that no additional heat resistance caused by a lead frame occurs below the component.

Advantageously, a second contact pad of the component is electrically coupled to the lead frame, particularly by wire bonding.

Since the second contact pad electrically connects to the lead frame, the lead frame may serve as a soldering joint for the component.

Furthermore, we provide a method of producing electrical components, the method comprising: providing a carrier sheet; depositing a lead-frame arrangement on the carrier sheet, the lead-frame arrangement comprising a plurality of passage openings; placing at least one respective component in a respective passage opening, a respective first contact pad of the components being brought into contact with the carrier sheet; electrically coupling a respective second contact pad of the components with the lead-frame arrangement; depositing encapsulations on the electrical components and on the lead-frame arrangement to mechanically couple the respective components to the lead-frame arrangement; removing the carrier sheet; and singularising the components.

In the following detailed description, reference is made to the accompanying drawings which are a part thereof and in which for the purpose of illustration specific examples are shown. In this regard, directional terminology such as "top," "bottom," "front," "back," and the like are used with reference to the orientation of the described drawings. Since components of examples may be positioned in a number of different orientations, the directional terminology only serves the purpose of illustration and is in no way limiting. Of course, other examples may be used and structural as well as logical modifications may be made without exceeding the protective scope of the appended claims. Of course, the features of the different examples described herein may be combined unless specified otherwise. Thus, the following detailed description is by no means to be considered limiting and the protective scope is defined in the appended claims.

Terms such as "connected," "contacted" and "coupled" are used to describe a direct as well as an indirect connection, a direct or indirect contact as well as a direct or indirect coupling.

In the drawings, identical or similar elements are provided with identical reference numerals wherever appropriate. For clarity's sake, not all elements of the drawings can be provided with specific reference numerals. This is particularly true for elements identical to other elements. Thus, the description and reference numerals can apply to all elements depicted in a graphically identical manner.

FIG. 1 shows an example of a carrier sheet 1. Shown herein are a top view and a sectional view along the lines "A-A." The carrier sheet 1 may, e.g., consist of ethylene-tetrafluoroethylene (ETFE) or polyethylene (PE). It may be an adhesive film to which, e.g., a lead frame 2 is glued, cf. FIG. 2. The carrier sheet 1 may have a thickness of 20 to 100 µm, particularly 50 µm. The carrier sheet 1 may serve as a basis for the configuration of a component 15 since all further elements of the component 15 are directly or indirectly arranged thereon.

Figure 2:
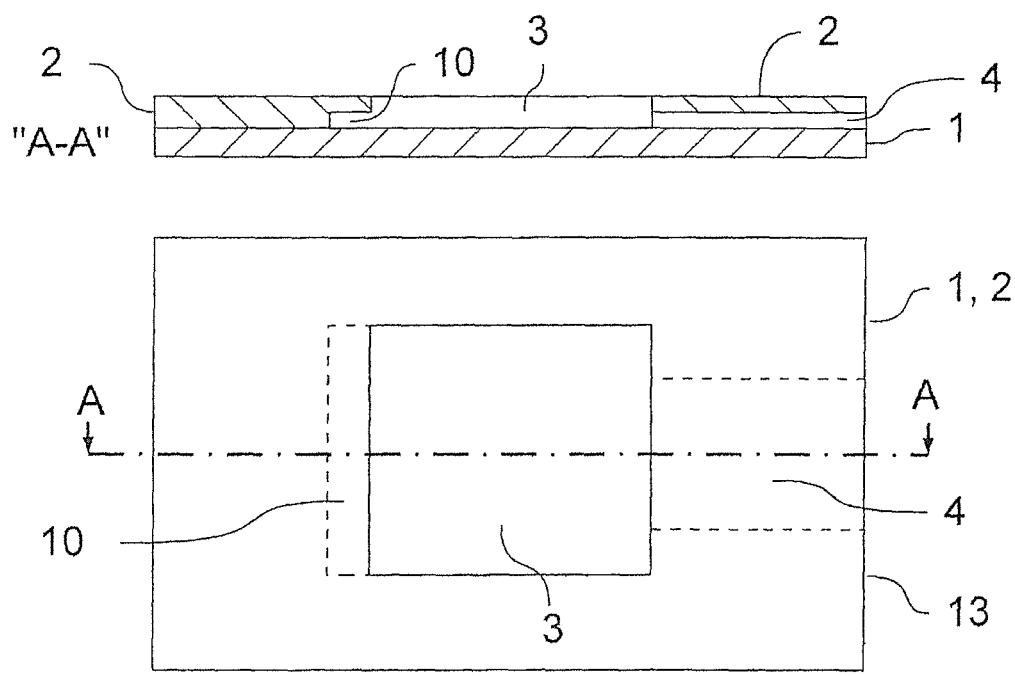
FIG. 2 depicts an example of a carrier sheet comprising a lead frame.

FIG. 2 shows an example of a carrier sheet 1 as described in context with FIG. 1, with a lead frame 2. Again, a top view and a sectional view along the lines "A-A" are shown. The lead frame 2 generally consists of metal and may consist of copper. The copper material may be coated, e.g., by silver (AG), nickel-gold (Ni—Au), nickel-silver (Ni—Ag) or nickel-palladium-gold (Ni—Pd—Au). The lead frame 2 may have a thickness of 20 to 500 µm, particularly 150 µm.

The lead frame 2 comprises a passage opening 3 which may be arranged in the center of the lead frame 2. The term "passage opening" describes an aperture traversing the lead frame 2 from one side to another side which faces the first side. The passage opening 3 has to be big enough to arrange a component 5 therein, cf. FIG. 3. Although the passage opening 3 is shown with a rectangular shape, it may have other shapes. For example, it may have a square or trapezoidal shape, it may also be a rhombus or a polygon, an ellipse or a circle. Moreover, more than two passage openings 3 may be provided. In the top view, the lead frame 2 surrounds the passage opening 3 from the left side, the right side, from the top and from the bottom. Thus, the lead frame 2 forms a closed ring around the passage opening 3, reinforcing the mechanical stability of the lead frame 2 and, in consequence, of the component 15. The passage opening 3 may, e.g., be stamped or etched from the lead frame 2.

The lead frame 2 may have a recess 4 extending from an edge 13 of the lead frame 2 to the passage opening 3. The recess 4 connects at least one electrical connecting element from the edge 13 of the lead frame 2 to the component 5 arranged in the passage opening 3. The recess has to be deep enough, e.g., half of the lead frame's 2 thickness, and wide enough to make sure that the electrical connecting elements are not brought into electrical contact with the lead frame 2. Instead of originating from the right edge 13, the recess 4 may also originate from the left, the bottom or the top edge of the lead frame 2 shown in the top view. A plurality of recesses 4 may be provided, e.g., to contact a plurality of contact pads of the component 5 or for contact a plurality of components 5 within the passage opening 3. The recess 4 may be etched. If the first contact pad 6 of the component 5 may be connected by a via, the recess 4 is not required. The recess 4 may be filled with the encapsulation. In this manner, a short circuit may be avoided when soldering the components to a plate.

The lead frame 2 may have an anchoring structure 10. The anchoring structure 10 anchors the encapsulation 9, cf., e.g., FIG. 4, to the lead frame 2. It may be configured such that the encapsulation 9 contacts the two opposite sides, e.g., the top and the bottom side of the lead frame 2 in the sectional view of FIG. 2 so that movement of the encapsulation 9 to the top or to the bottom relative to the lead frame 2 is prevented. In the top view of FIG. 2, a movement of the encapsulation 9 to the left or right or, respectively, to the top or bottom through the passage opening 3 is prevented. In the top view of FIG. 2, the anchoring structure 10 is only shown at the left edge of the passage opening 3. It may also be arranged at the right, the top or the bottom edge, or at a combination of the edges of the passage opening 3. The lead frame 2 may comprise further anchoring structures 10 that, e.g., consist of further passage openings 3 in the lead frame 2. Since no components 5 have to be admitted to the further passage openings 3, these may be smaller than the passage opening 3 shown herein.

Figure 3:
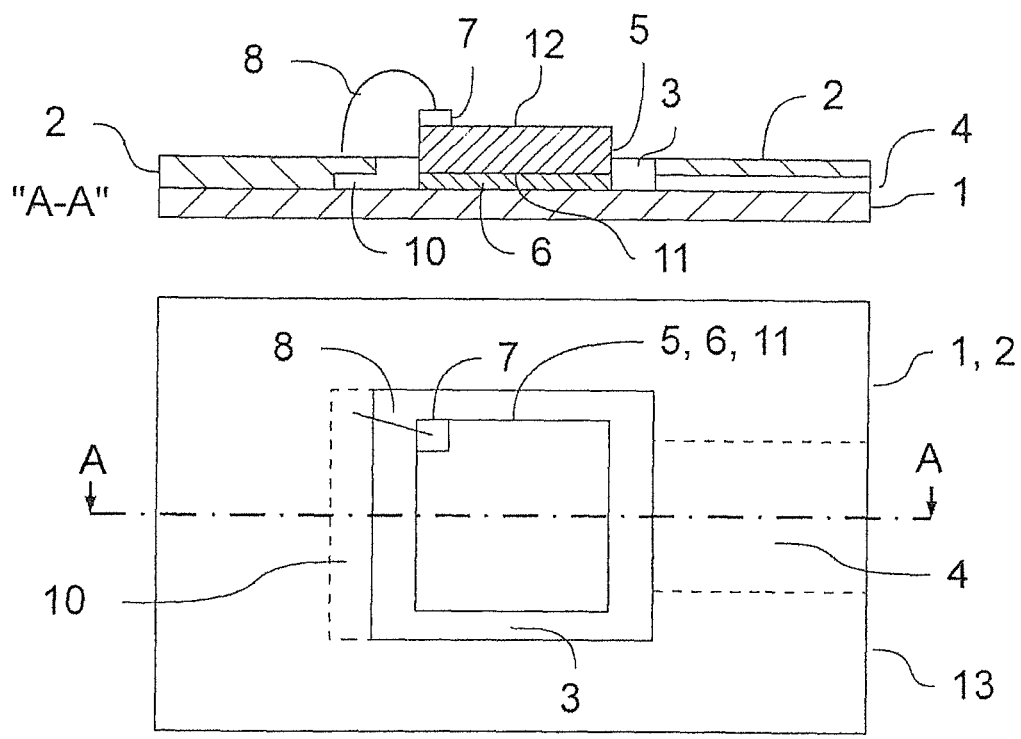
FIG. 3 shows an example of a carrier sheet comprising a lead frame and a component.

FIG. 3 shows an example of a carrier sheet 1 with a lead frame 2 as described in conjunction with FIGS. 1 and 2, and a component 5. The Figure shows a top view and a sectional view along the lines "A-A." The component 5 may be any desired electrical component. It may be an opto-electrical component, particularly a light-emitting component, e.g., for an infrared range (IR) or for a range visible to humans. It may also be a detector for electro-magnetic radiation, e.g., in the infrared or visible range. The component 5 may comprise further components such as a circuit protecting against electrostatic discharge (ESD).

The component 5 comprises a first side 11 and a second side 12. The first side 11 and the second side 12 may face each other. On the first side 11, a first contact pad 6 is arranged which completely covers the first side 11. The first contact pad 6 may also only cover a part of the first side 11. Alternatively, more than one contact pad 6 may be arranged on the first side 11. On the second side 12, a second contact pad 7 is arranged which only covers a part of the second side 12. Since the second contact pad 7 does not cover the entire area of the component 5, the component 5 may receive or emit electro-magnetic radiation over a larger area. On the second side 12, the second contact pad 7 may be arranged as desired, even over the entire area, e.g., if it is transparent for the electro-magnetic radiation. The first contact pad 6 and the second contact pad 7 electrically connects the component 5. The first contact pad 6 may directly serve as a soldering joint of the component 15. The second contact pad 7 electrically connects to the lead frame 2 via a bond wire 8. The lead frame 2 may thus form a further soldering joint of the component 15.

The component 5 is inserted into the passage opening 3. The first contact pad 6 may be in contact with the carrier sheet 1. If the carrier sheet 1 is an adhesive film, the component 5 is fixed thereon by gluing. Since the lead frame 2 and the first contact pad 6 both rest on the carrier sheet 1, their surfaces—which in the sectional view are at the bottom—are in one plane. Since the first contact pad 6 and the lead frame 2 may form the contacting elements of the component 15, the component 15 may be soldered in a simple manner.

Figure 4:
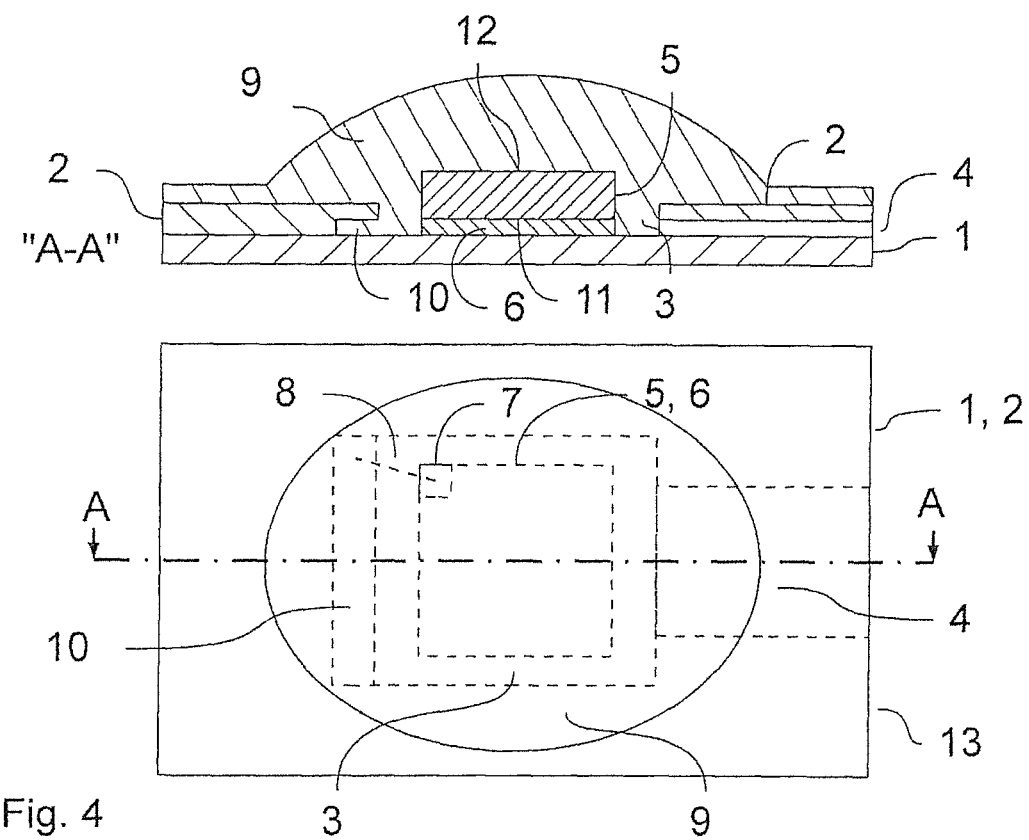
FIG. 4 shows an example of a carrier sheet comprising a lead frame, a component and an encapsulation.

FIG. 4 shows an example of a carrier sheet 1, a lead frame 2 and a component 5 as described in conjunction with FIGS. 1, 2 and 3, with an encapsulation 9. The Figure shows a top view and a sectional view along the lines "A-A." The encapsulation 9 may consist of polymers, epoxy material or silicone and it may be a compound. If the component 5 is an opto-electrical component, it is advantageous for the encapsulation 9 to be transparent to the electro-magnetic radiation for which the component 5 is configured. For visible light, the encapsulation 9 may be lucid, for infrared detectors it may be black.

The encapsulation 9 may be configured as a lens so that the electro-magnetic radiation emitted by the component 5 can be radiated evenly or in a bundled manner. If the component 5 is to receive electro-magnetic radiation, the encapsulation 9 may be shaped such that the electro-magnetic radiation is focused onto the component 5.

The encapsulation 9 may be a mold material and may flow into the passage opening 3 and into the anchoring structure 10 so that it solidly connects to the lead frame 2. It may cover the component 5 and the bond wire 8 and protect them against damage. It may extend to the edges 13 of the lead frame 2, or not.

Figure 5:
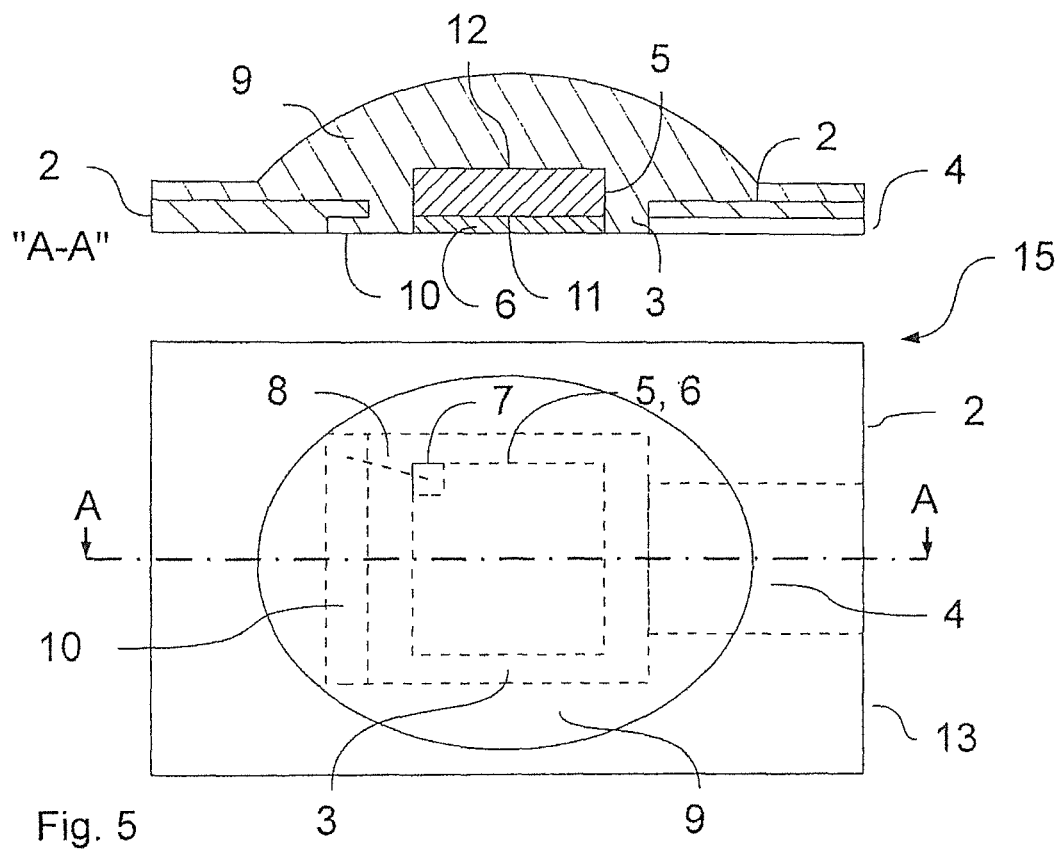
FIG. 5 depicts an example of a component.

FIG. 5 shows an example of a component 15 in a top view and in a sectional view along the lines "A-A." The component 15 is configured as described in conjunction with FIG. 4, whereas in comparison to FIG. 4 the carrier sheet 1 has been removed. If the carrier sheet 1 is an adhesive film or was fixed by glue, it may be stripped from the lead frame 2. The component 5 and the lead frame 2 are held together by the encapsulation 9. Since the lead frame 2 is closed, i.e., surrounds the component 5 in a ring-shape without interruptions, it has a sufficiently high mechanical stability. Additional mechanical support structures are not required.

As shown in the sectional view, the first contact pad 6 and the lead frame 2 are bared towards the bottom and may be electrically contacted to connect the component 15. Electrical lines leading to the first contact pad 6 may be guided through the recess 4 without short circuits occurring with the electrically conductive lead frame 2.

Heat generated by the component 5 may be discharged directly to the corresponding soldering joint via the first contact pad 6. The heat resistance of a lead frame on which the component 5 is usually arranged is omitted. Since the component 5 is not arranged on a lead frame but in a passage opening 3 of a lead frame 2, the electrical component 15 has a lower height.

Figure 6:
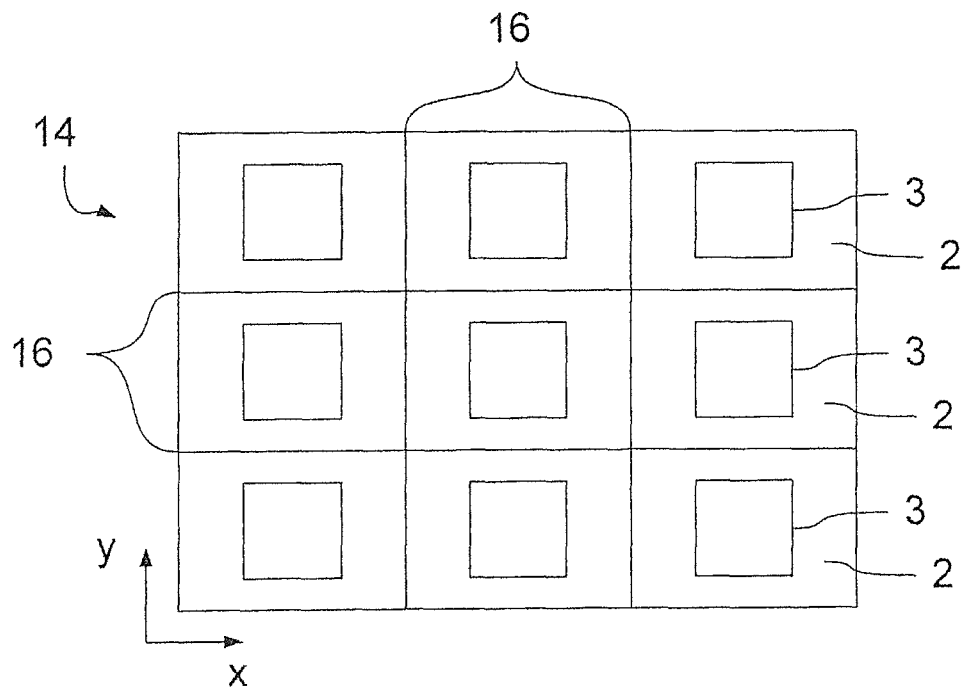
FIG. 6 shows an example of a lead-frame arrangement.

FIG. 6 shows an example of a lead-frame arrangement 14 in a top view. The steps described in FIGS. 1 to 5 for producing a component 15 may efficiently be carried out for a plurality of components 15 by a lead-frame arrangement 14. Instead of one single lead frame 2, a lead-frame arrangement 14 is arranged on the carrier sheet 1. The lead-frame arrangement 14 has the shape of a plurality of connected lead frames 2 with a corresponding plurality of passage openings 3 arranged in a matrix-shape in a first direction X and a second direction Y. The steps described in conjunction with FIGS. 1 to 5 are carried out for each single passage opening 3. The steps may partly be carried out in a parallel manner for a plurality of passage openings 3. The carrier sheet 1 may be removed and the lead-frame arrangement 14 may be separated along the parting lines 16 along the first direction X and the second direction Y to obtain individual components 15, e.g., by stamping or sawing procedures.

The invention claimed is:

1. An electrical component comprising:
   a closed lead frame with a passage opening;
   at least one electrical component arranged within the passage opening, the electrical component comprising a first contact pad on one side of the electrical component and a second contact pad on a second side of the electrical component, wherein the second side faces the first side and the second contact pad is electrically coupled to the lead frame; and
   an encapsulation which mechanically couples the electrical component to the lead frame, wherein the lead frame comprises a recess on one side, the recess extending from an edge of the lead frame to the passage opening and connecting at least one electrical connecting element from the edge of the lead frame to the component arranged in the passage opening.

2. The electrical component of claim 1, wherein the lead frame comprises at least one anchoring structure configured such that the encapsulation is anchored to the lead frame.

3. The electrical component of claim 1, which is an opto-electrical component, a light-emitting component, or a light-emitting diode, and the encapsulation is transparent to the electro-magnetic radiation.

4. The electrical component of claim 3, wherein the encapsulation forms a lens for the opto-electrical component.

5. The electrical component of claim 1, wherein the encapsulation is a mold material.

6. A method of producing an electrical component comprising:
- providing a carrier sheet;
- depositing a closed lead frame on the carrier sheet, the lead frame comprising a passage opening;
- placing at least one component into the passage opening of the lead frame, a first contact pad of the component being brought into contact with the carrier sheet;
- electrically coupling a second contact pad of the component to the lead frame;
- depositing an encapsulation on the electrical component and on the lead frame, the encapsulation mechanically coupling the electrical component to the lead frame; and
- removing the carrier sheet, wherein the lead frame comprises a recess on one side, the recess extending from an edge of the lead frame to the passage opening and connecting at least one electrical connecting element from the edge of the lead frame to the component arranged in the passage opening.

7. The method of claim 6, wherein the second contact pad of the component is electrically coupled to the lead frame by wire bonding.

8. The method of claim 6, wherein the lead frame comprises at least one anchoring structure configured such that the encapsulation is anchored to the lead frame.

9. The method of claim 6, wherein the lead frame is part of a lead-frame arrangement being arranged on the carrier sheet, and
- wherein the lead frames with the components are singularized after removing the carrier sheet.

10. The method of claim 6, wherein the encapsulation is a mold material.

11. An electrical component comprising:
- a closed lead frame with a passage opening;
- at least one electrical component arranged within the passage opening, the electrical component comprising a first contact pad on one side of the electrical component and a second contact pad on a second side of the electrical component, wherein the second side faces the first side and the second contact pad is electrically coupled to the lead frame; and
- an encapsulation which mechanically couples the electrical component to the lead frame;

wherein the lead frame comprises at least one anchoring structure configured such that the encapsulation is anchored to the lead frame.

12. The electrical component of claim 11, wherein the lead frame comprises a recess on one side, the recess extending from an edge of the lead frame to the passage opening and connects at least one electrical connecting element from the edge of the lead frame to the component arranged in the passage opening.

13. The electrical component of claim 11, which is an opto-electrical component, a light-emitting component, or a light-emitting diode, and the encapsulation is transparent to the electro-magnetic radiation.

14. The electrical component of claim 13, wherein the encapsulation forms a lens for the opto-electrical component.

15. The electrical component of claim 11, wherein the encapsulation is a mold material.

* * * * *